(12) United States Patent
Hu

(10) Patent No.: US 8,461,671 B2
(45) Date of Patent: Jun. 11, 2013

(54) MINIATURE PACKAGING FOR DISCRETE CIRCUIT COMPONENTS

(76) Inventor: Jerry Hu, Taipei (TW)

( * ) Notice: Subject to any disclaimer, the term of this patent is extended or adjusted under 35 U.S.C. 154(b) by 0 days.

(21) Appl. No.: 13/115,709

(22) Filed: May 25, 2011

(65) Prior Publication Data

US 2012/0104414 A1 May 3, 2012

(30) Foreign Application Priority Data

May 24, 2010 (TW) .............................. 99116443 A

(51) Int. Cl.
*H01L 23/02* (2006.01)
*H01L 23/48* (2006.01)
*H01L 21/00* (2006.01)

(52) U.S. Cl.
USPC 257/678; 257/E27.07; 257/690; 257/E23.001; 438/460; 438/462

(58) Field of Classification Search
None
See application file for complete search history.

(56) References Cited

U.S. PATENT DOCUMENTS

| | | | | |
|---|---|---|---|---|
| 5,303,120 | A * | 4/1994 | Michii et al. | 361/760 |
| 6,008,529 | A * | 12/1999 | Wu | 257/676 |
| 6,441,475 | B2 * | 8/2002 | Zandman et al. | 257/685 |
| 6,806,583 | B2 * | 10/2004 | Koay et al. | 257/787 |

* cited by examiner

*Primary Examiner* — Julio J Maldonado
*Assistant Examiner* — Harpreet Singh
(74) *Attorney, Agent, or Firm* — Arent Fox LLP

(57) ABSTRACT

A miniature packaging for a discrete circuit component that comprises a core dice for the circuit component fabricated on a semiconductor substrate. The core dice has at least a pair of metallization electrodes formed on the same or different surfaces of the semiconductor substrate. An end electrode covers a corresponding side surface of the core dice and electrically connects to a corresponding one of the pair of metallization electrodes. The end electrode extends toward the center of the core dice on both the top and bottom surface of the core dice.

6 Claims, 5 Drawing Sheets

MINIATURE PACKAGING FOR DISCRETE CIRCUIT COMPONENTS

BACKGROUND OF THE INVENTION

1. Field of the Invention

The present invention relates in general to the packaging of semiconductor circuit components and, in particular, to a miniature packaging of discrete circuit components. More particularly, the present invention relates to the packaging of semiconductor circuit component at the semiconductor wafer level.

2. Description of the Related Art

Under the continuous trend of miniaturization of portable consumer electronics devices such as cell phones and personal digital assistant (PDA), discrete circuit components such as diodes and transistors are also becoming ever smaller. Diodes to the JEDEC (Joint Electronic Devices Engineering Council) 0402 specification are now common. Even smaller 0201 devices at 0.6 mm (L)×0.3 mm (W) are also emerging.

Surface mount packages of discrete circuit components for devices such as diodes and LED can now be found commonly in the form of, for example, (1) cylindrical glass/plastic packages, (2) lead-frame-based leaded packages, (3) flat-pack leadless rectangular packages, and (4) flip-chip packages.

Among the common packages, the fourth form, flip-chip, is advantageously featured as light, thin and small, however, it is expensive to fabricate. Flip-chip discrete components are currently a step away from mass commercialization also due to their difficulties in handling as well as poor reliability and performance characteristics. The former three forms of conventional discrete components described above, by comparison, are the dominant products. However, as the trend is for higher electrical performances, smaller and lighter packaging, these conventional packaging technologies are facing the limitation in their circuit dice/package body volumetric utilization at about 7 percent. This implies an inefficient utilization of the device size as the circuit dice takes up only 7 percent of the volume of that of the packaged product. Other disadvantages include limitations in the compliance to environmental protection regulations, the complication of packaging procedure, as well as the material used for the construction of the packaging.

Thus, although there is the matured pick-and-place technique and equipment available for the mass production application of these miniature discrete circuit components, cost of these devices constitutes the main obstacle for their widespread use. The main reason for their high costs stems from the conventional idea of the utilization of an initial substrate that serve as the base for the construction of the packaging of these devices. The use of such a substrate leads to the requirement of the use of expensive wire-bonding (in terms of both the costly gold-wire and the bottleneck of wire-bonding) or the use of the volumetrically inefficient lead-frame packaging.

SUMMARY OF THE INVENTION

It is therefore an object of the present invention to provide a miniature packaging that improves the circuit dice/package body volumetric utilization up to at least 50 percent while maintaining good characteristic for pick & place handling.

It is another object of the present invention to provide a miniature packaging that discards the need for a physical base substrate and lead-frame but with improved product yield rate and quality.

It is another object of the present invention to provide a miniature packaging that simplifies and therefore reduces the costs for the fabrication of discrete circuit components.

It is another object of the present invention to provide a miniature packaging that is more compatible to environmental regulation requirements including RoHS (Restriction of Hazardous Substance Directive), Halogen Free and WEEE (Directive on the Waste Electronics and Electrical Equipment).

It is another object of the present invention to provide a miniature packaging that has improved power dissipation and reliability.

In order to achieve the above and other objects, the present invention provides a miniature packaging for a discrete circuit component that comprises a core dice for the circuit component fabricated on a semiconductor substrate. The core dice has at least a pair of metallization electrodes formed on the same or different surfaces of the semiconductor substrate. An end electrode covers a corresponding side surface of the core dice and electrically connects to a corresponding one of the pair of metallization electrodes. The end electrode extends toward the center of the core dice on both the top and bottom surface of the core dice.

The present invention further provides a process for fabricating a miniature packaging for a discrete circuit component that comprises fabricating a plurality of core dices for said circuit component on a semiconductor substrate, each of said core dices are arranged in a matrix of a plurality of rows in said substrate and having at least a pair of metallization electrodes formed on the same or different surfaces of said semiconductor substrate; physically separating each of said plurality of rows of core dices out of said substrate into individual rows; and simultaneously forming an end electrode covering a corresponding side surface of said row of core dices and electrically connecting to a corresponding one of said pair of metallization electrodes of individual core dices in said row, said end electrode extending toward the center of said core dice on both the top and bottom surface of said core dice.

DETAILED DESCRIPTION OF THE PREFERRED EMBODIMENTS

Figure 1:
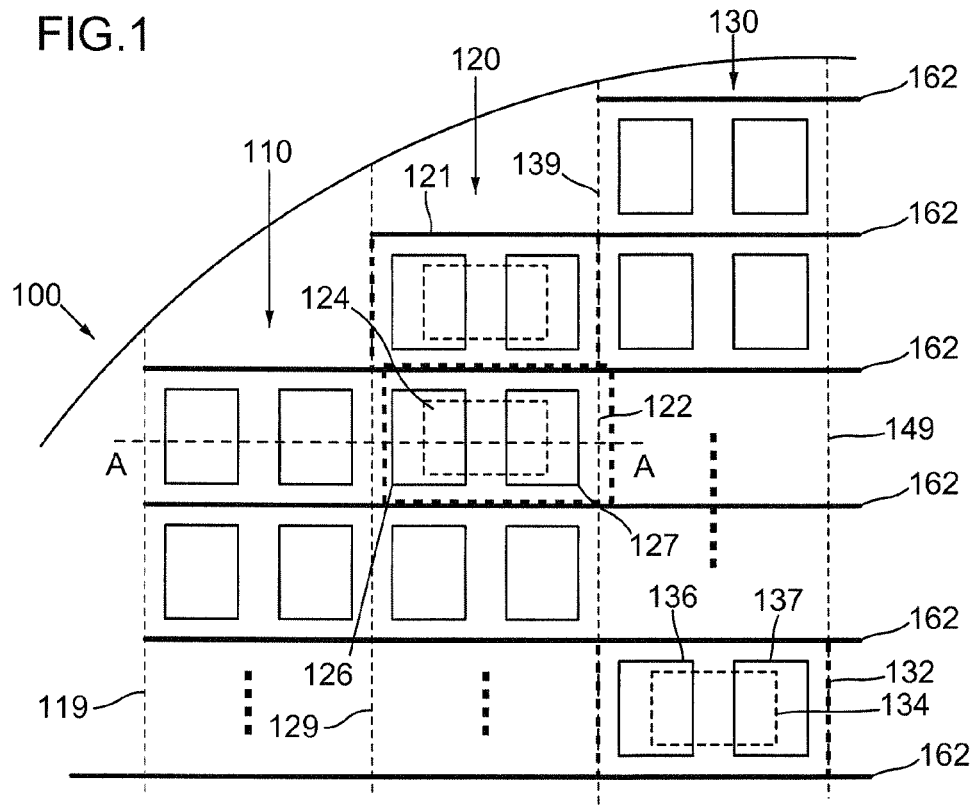
FIG. 1 schematically illustrates the fabrication of individual diode core dice on a semiconductor substrate that can be used for the miniature packaging in accordance with a preferred embodiment of the present invention.

FIG. 1 schematically illustrates the fabrication of, for example, individual diode core dice on a semiconductor substrate that can be used for the miniature packaging in accordance with a preferred embodiment of the present invention. As is comprehensible to those in the art, although the following description uses a diode fabricated on a silicon semiconductor substrate as an example, however, the circuit component for the miniature packaging is not limited to diodes, and the substrate is not limited to silicon. Other semiconductor technologies such as GaAs and GaP of the III-V group can be used for the fabrication of circuit dices such as LED, or diodes on SiC substrate.

Also, the illustrations of the inventive miniature packaging in the drawings may not be drawn to the exact scale. Some dimensions of the describe packaging may be exaggerated for the convenience of the description of the present invention.

Figure 2:
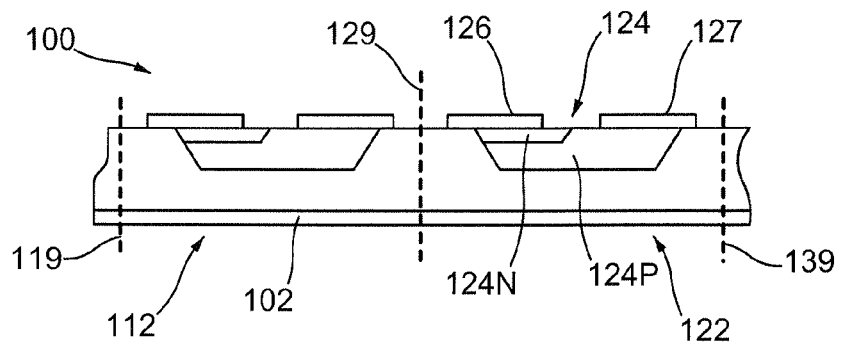
FIG. 2 illustrates the cross section of the semiconductor substrate of FIG. 1 taken along the A-A line.

The illustration of FIG. 1 is the top view of a wafer 100. Although not shown in FIG. 1, however, as illustrated in FIG. 2, which is a cross-sectional view of the wafer taken along the A-A line in FIG. 1, the bottom side of the wafer 100 may have an insulating protective layer 102. Protective layer 102 may be formed by first applying a layer of a solution or a paste of an organic high-polymeric material (such as 2-polyimide), oxide, or glass of about 10-200 micrometer thick via painting or printing deployment. Then the coated layer may be formed by baking or firing. This protective layer 102 at the back of the wafer 100 also serves as a substrate for the wafer.

FIG. 1 illustrates the fabricated matrix of rows and columns of individual diode cores indicated by phantom-line rectangles 124 on the wafer 100. Each of the diode cores has its own P and N electrodes. Take, for example, diode 124, a pair of electrodes 126 and 127 are formed on the top surface of the wafer 100, and for core 134, there are electrodes 136 and 137. These electrodes can be fabricated using the typical metallization process for semiconductor integrated circuit fabrication. Metallic components used for such electrode metallization may include, for example, aluminum, silver, gold, tin and lead as well as the alloys thereof.

The diode core matrix fabricated into the wafer 100 can be divided into rows of individual semi-packaging (of circuit component) 121, 122 and 132 identified by their respective coarse phantom-lined rectangles. For example, semi-packaging 121 and 122 are in the same semi-packaging row 120, and 132 in row 130. Each of the semi-packaging rows, 110, 120 and 130 illustrated in the wafer 100 for example, can be separated out of the wafer 100 via physical separation by, for example, laser cutting along the vertical scribe line 119, 129, 139 and 149.

Before the physical separation of these semi-packaging rows 110, 120 and 130 from the wafer 100, however, dice separation weakening grooves between consecutive dices, for example, groove 162 between dices 121 and 122 in row 120 must be formed. Each of these separation weakening grooves may, for example, be a thin groove that cuts into the surface of the wafer 100 formed, for example, by controlled laser cutting. In a preferred embodiment, these grooves can have a depth that is between 10 to 90 percent of the thickness of the wafer 100 starting from the surface. Exact depth of these grooves depends on the nature of the circuit dices but should not reach down to the insulation protective layer 102 on the bottom side of the wafer.

Each of these separation weakening grooves 162 provides for an easy physical separation of dices (ex. 121 and 122) in one semi-packaging row (ex. 120) via the application of a mechanical force after the completion of the packaging procedural steps for each row. However, all these separation weakening grooves 162 must also be able to maintain the structural integrity of each row (110, 120 and 130 in FIG. 1) during the processing of the row.

Figure 3:
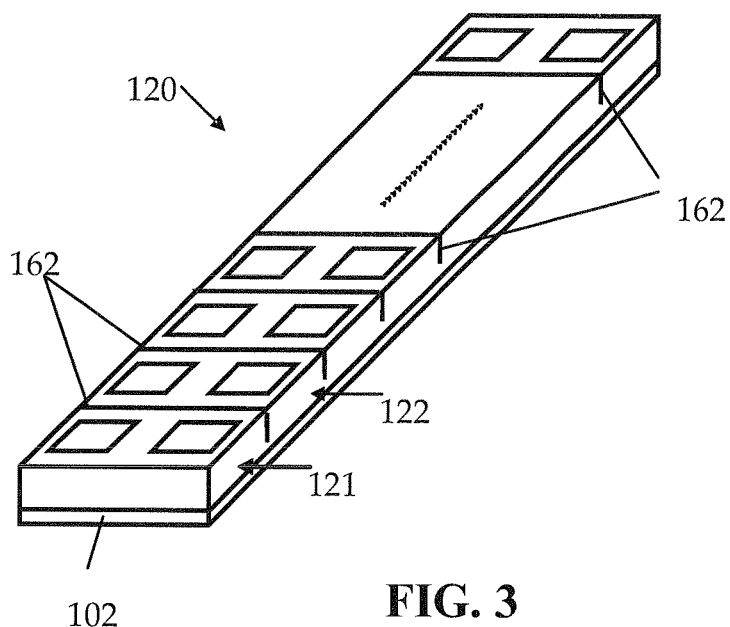
FIG. 3 illustrates the perspective view of a row of semi-packaging cut out of the substrate of FIG. 1.

FIG. 3 illustrates the perspective view of a row 120 of semi-packaging cut out of the substrate 100 of FIG. 1 along the cutting routes 129 and 139. As is illustrated, multiple separation weakening grooves 162 cut into the surface of the semi-packaging row 120 between the entire row of individual circuit dices, 121 and 122 for example.

Figure 4:
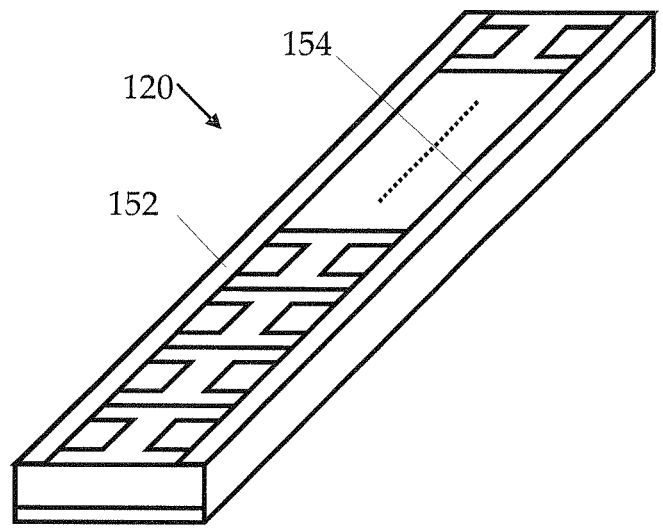
FIG. 4 illustrates the formation of side-insulation of the semi-packaging row of FIG. 3.
Figure 5:
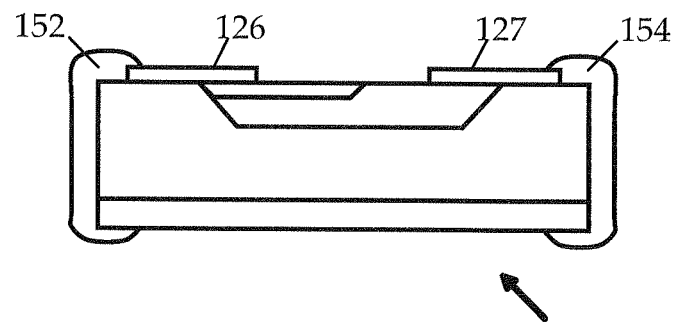
FIG. 5 illustrates the cross section of one device in the row of FIG. 4.

FIG. 4 illustrates the formation of side-insulation of the semi-packaging row 120 of FIG. 3. These two side-insulation layers 152 and 154 are formed via first coating the side surfaces of the row 120 exposed after the row's separation from the wafer 100 via cutting along the cutting routes described above using paste or solution of electrically insulating material such as polyimide paste, glass paste or oxide. The coating can be achieved, as comprehensible to those skilled in the art, via dipping in or painting with the solution of the insulation material. Subsequent baking or firing sets the insulating layers 152 and 154 on the side faces of the semi-packaging row 120. FIG. 5 illustrates the cross-sectional view of one device 122 in the semi-packaging row 120 of FIG. 4. In a preferred embodiment, each of the insulation layers 152 and 154 extends inwardly toward the center of the device on both the top and bottom surfaces. Such extensions cover part of the outer surface of the electrodes 126 and 127 of the device.

Figure 6:
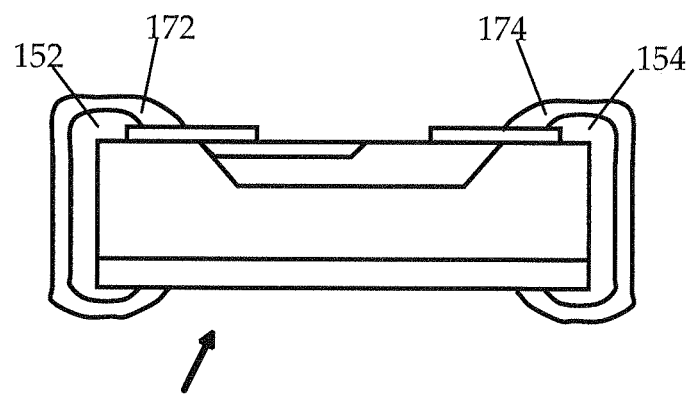
FIG. 6 illustrates the formation of end electrodes on the semi-packaging of FIG. 5.

Then, FIG. 6 illustrates the formation of end electrodes on the semi-packaging row 120 as depicted in the cross-sectional view of the dice 122 described in FIG. 5. End electrodes 172 and 174 are formed via first coating the side surfaces of the dice 122 (in the row 120) already covered by insulation layers 152 and 154 using paste or solution of one or more electrically conductive material such as silver, gold, copper, tin, aluminum and lead as well as alloys thereof. The coating can be achieved via dipping in or painting with the solution of the conductive material. Subsequent baking or firing under controlled atmospheric conditions sets the conductive layers 172 and 174 on the side faces of the semi-packaging row 120.

An alternative implementation of the making of end electrodes 172 and 174 involves the deployment of an electrically conductive paste, for example, via screen printing on the surface of the wafer of FIG. 1 before the semi-packaging rows (110, 120, 130) are physically separated from the wafer 100. As is comprehensible, such conductive paste deployment covers only the metallization (for example, 126 and 127 for dice 122 shown in FIG. 1) of the electrodes of each dice on the wafer 100. Again, the electrically conductive paste may contain material including silver, gold, copper, tin, aluminum and lead as well as alloys thereof. Subsequent baking or firing under controlled atmospheric conditions sets the conductive layers deployed. End electrodes for individual dices such as electrodes 172 and 174 for dice 122 come into shape after the semi-packaging rows are cut free from the wafer, and individual side-conductive layers formed by, for example, sputtering or vapor deposition of electrically conductive material on the side surface of the rows the also covers the top-deployed electrically conductive layers.

As is clearly illustrated in the cross-sectional view of FIG. 6, end electrodes 172 and 174 extend inwardly to the center of the device 122 and electrically contact their respective electrode metallization 126 and 127 on the top surface of the device. This electrical connection serves to extend the P and N electrodes of the diode core to the side surfaces and to the bottom edges of the device. Although not illustrated in the drawing but as is comprehensible to those skilled in this art, end electrodes 172 and 174 can further undergo electroplating procedure to have a top nickel and tin coating layer, as is typically found in the electrodes of discrete circuit components.

Figure 7:
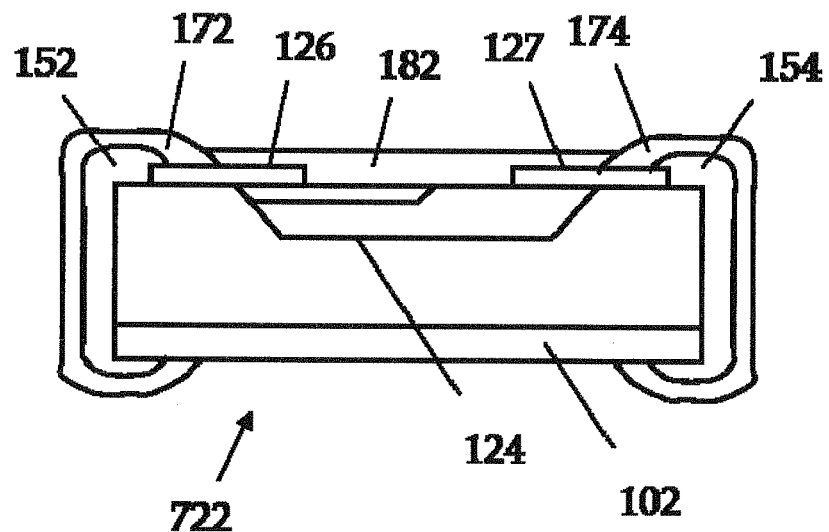
FIG. 7 illustrates the cross-sectional view of a miniature packaging obtained after the formation of top surface protective layer on the semi-packaging row and then broken out from the row mechanically along the separation weakening grooves.

FIG. 7 illustrates the cross-sectional view of a miniature packaging 722 obtained after the formation of top surface protective layer 182 on the semi-packaging row and then broken out from the row mechanically along the separation weakening grooves. The surface protective layer 182 can be made by first deploying, for example, a paste of electrically insulating material such as polyimide, glass or oxide and then baking or firing. Protective layer 182 serves to cover the portion of the electrode metallization 126 and 127 exposed and the center top surface of the dice 122.

After the formation of the insulating protective layer 182 in FIG. 7, each individual units in the semi-packaging row (FIG. 3) can be physically separated from the row. This can be done easily by mechanically breaking along each separation weakening grooves (162 in FIG. 3).

Figure 8:
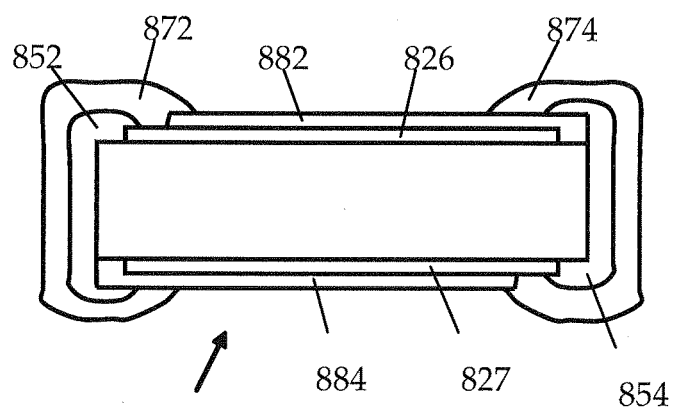
FIG. 8 illustrates the cross-sectional view a miniature packaging for a diode in accordance with another embodiment of the present invention.

FIG. 8 illustrates the cross-sectional view a miniature packaging 822 for a diode in accordance with another embodiment of the present invention. Miniature packaging 822 is slightly different from 722 of FIG. 7 although they share basically the same fabrication procedural steps. The difference lies in that the core dice of the device of FIG. 8 has P and N electrodes on top and bottom surface instead of on the same side as the device of FIG. 7.

Figure 9:
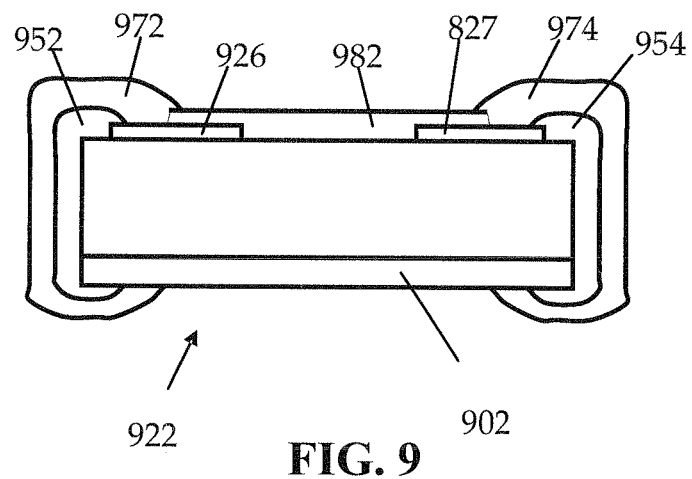
FIG. 9 illustrates the cross-sectional view of a miniature packaging for a diode in accordance with still another embodiment of the present invention.

FIG. 9 illustrates the cross-sectional view of a miniature packaging 922 for a diode in accordance with still another embodiment of the present invention. The difference between packaging 922 and 722 is that the formation of the top insulation layer 982 precedes the formation of end electrode layers 972 and 974.

Figure 10:
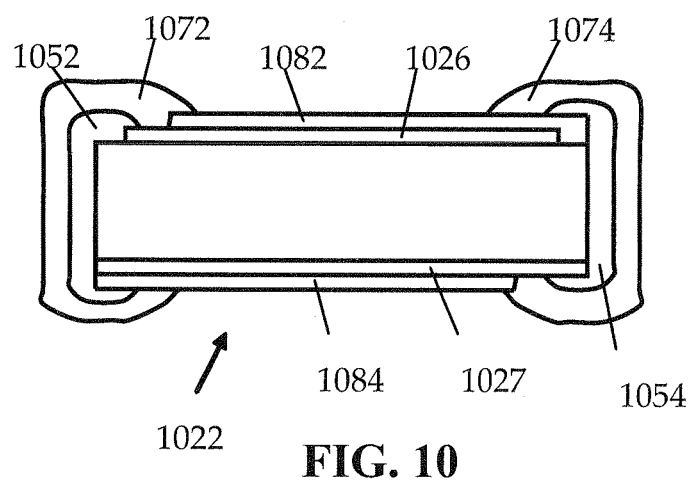
FIG. 10 illustrates the cross-sectional view of a miniature packaging for a diode in accordance with yet another embodiment of the present invention.

FIG. 10 illustrates the cross-sectional view of a miniature packaging 1022 for a diode in accordance with yet another embodiment of the present invention. Packaging 1022 is different from 822 of FIG. 8 in that the bottom electrode metallization 1027 occupies the entire bottom surface of the device.

The above-described preferred embodiments of the miniature packaging of the present invention show that the use of the circuit component core wafer itself as the substrate for the construction of discrete circuit component has an important advantage. The miniature packaging of the present invention discards the need for the bulky physical printed circuit board, metallic plate, or ceramic plate as the base for the construction of discrete circuit components. At least the following benefits arise from the packaging of the present invention:

Much extended volumetric minimization of discrete circuit components. Circuit dice/package body volumetric utilization up to 50 percent and more is possible using the miniature packaging technology of the present invention. This compares to the conventional at about 7 percent.

Without the need for the physical substrate and the need for lead-frame, both fabrication yield rate and device quality improve significantly. Cost also reduces significantly.

Due to simplified fabrication, the miniature packaging of the present invention allows for more flexibility in the selection of materials needed for the construction of the discrete circuit components. More compatibility to environmental standards RoHS, Halogen Free and WEEE is possible.

Meanwhile, although the miniature packaging technology has been described in the above paragraphs as being particularly suitable for small discrete circuit devices, however, any miniature packaging of the present invention is also suitable to be used as the core for the secondary construction of devices of larger dimensions such as SMC, SMB, SMA and SOD-123, etc.

For example, a miniature packaging of a diode of the present invention is easily used as the device core for a simplified, efficient and low-cost construction of a larger discrete diode. Device such as that of FIGS. 7, 8 and 9 are applicable to the secondary construction using a simple substrate and that calls for highly-efficient automated production. No costly and bottleneck die-bonding and wire-bonding are necessary.

While the above is a full description of the specific embodiments of this miniature packaging invention, various modifications, alternative constructions and equivalents may be used. For example, light-emitting diodes are also applicable to the inventive miniature packaging in addition to the conventional diodes described in the exemplifying embodiments. Therefore, the above description and illustrations should not be taken as limiting the scope of the present invention.

What is claimed is:

1. A process for fabricating a miniature packaging for a discrete circuit component comprising:
    fabricating a plurality of core dices for said circuit component on a semiconductor substrate, each of said core dices are arranged in a matrix of a plurality of rows in said substrate and having at least a pair of metallization electrodes formed on the same or different surfaces of said semiconductor substrate;
    physically separating each of said plurality of rows of core dices out of said substrate into individual rows; and
    simultaneously forming an end electrode covering a corresponding side surface of said row of core dices and electrically connecting to a corresponding one of said pair of metallization electrodes of individual core dices in said row, said end electrode extending toward the center of said core dice on both the top and bottom surface of said core dice.

2. The process of claim 1 wherein said step of fabricating said plurality of core dices further comprises forming cutting routes between said rows of core dices.

3. The process of claim 1 wherein said semiconductor substrate is a silicon substrate or an SiC substrate.

4. The process of claim 1 wherein said circuit component is a diode.

5. The process of claim 1 wherein said circuit component is a light-emitting diode.

6. The process of claim 1, further comprising providing a side-insulating layer between the substrate and the end electrode covering.

* * * * *